US010665779B2

(12) United States Patent
Russell et al.

(10) Patent No.: US 10,665,779 B2
(45) Date of Patent: *May 26, 2020

(54) METHODS FOR ADDITIVE FORMATION OF A STT MRAM STACK

(71) Applicant: Tokyo Electron Limited, Tokyo (JP)

(72) Inventors: Noel Russell, Waterford, NY (US); Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/127,042

(22) Filed: Sep. 10, 2018

(65) Prior Publication Data
US 2019/0019946 A1 Jan. 17, 2019

Related U.S. Application Data

(63) Continuation of application No. 15/158,183, filed on May 18, 2016, now Pat. No. 10,109,789.

(51) Int. Cl.
H01L 29/82 (2006.01)
H01L 43/12 (2006.01)
(Continued)

(52) U.S. Cl.
CPC ............ H01L 43/12 (2013.01); G11C 11/161 (2013.01); H01L 43/02 (2013.01); H01L 43/08 (2013.01)

(58) Field of Classification Search
CPC ......... H01L 43/12; H01L 43/02; H01L 43/08; G11C 11/161
See application file for complete search history.

(56) References Cited

U.S. PATENT DOCUMENTS 5,534,743 A * 7/1996 Jones ............... G01R 33/10
313/309
6,828,639 B2 12/2004 Nejad et al.
(Continued)

FOREIGN PATENT DOCUMENTS

JP 2002-299724 A 10/2002
JP 2003-123625 A 4/2003
(Continued)

OTHER PUBLICATIONS

Combined Office Action and Search Report dated Jan. 18, 2019 in Taiwanese Patent Application No. 106116028, with English translation, 8 pages.
(Continued)

Primary Examiner — Stephen M Bradley
Assistant Examiner — Wasiul Haider
(74) Attorney, Agent, or Firm — Oblon, McClelland, Maier & Neustadt, L.L.P.

(57) ABSTRACT

Methods for additive formation of a STT-MRAM metal stack using a deposition process through a pre-patterned template that skims away metal ions that are less likely to enable anisotropic deposition on a substrate. The pre-patterned template is formed from a film stack using patterning techniques to form an opening in the film stack that exposes portions of an underlying substrate where a MTJ will be formed for an MRAM cell. The film stack cavity may be exposed to etch processes that selectively pull back the sidewall, such that other layers in the film stack protrude into the cavity. Additional treatments to the other layers may alter the opening sizes in the other layers. Metal deposited through the cavity such that metal ions with anisotropic characteristics will be skimmed away before reaching the substrate.

20 Claims, 9 Drawing Sheets

(51) Int. Cl.
*G11C 11/16* (2006.01)
*H01L 43/02* (2006.01)
*H01L 43/08* (2006.01)

(56) References Cited

U.S. PATENT DOCUMENTS

| | | | |
|---|---|---|---|
| 10,109,789 B2* | 10/2018 | Russell | G11C 11/161 |
| 2005/0170628 A1 | 8/2005 | Sharma et al. | |
| 2011/0272770 A1 | 11/2011 | Hatada | |
| 2017/0194195 A1* | 7/2017 | Cohen | H01L 21/0331 |

FOREIGN PATENT DOCUMENTS

| | | | |
|---|---|---|---|
| JP | 2010-040616 A | 2/2008 | |
| JP | 2011-238679 A | 11/2011 | |
| TW | 1236100 B | 7/2005 | |
| TW | 200522258 A | 7/2005 | |

OTHER PUBLICATIONS

Office Action dated Sep. 27, 2018 in corresponding Patent Application No. 10-2017-0061632 (with English Translation), 22 pages.
Office Action dated Mar. 19, 2019 in the corresponding Japanese Patent Application No. 2017-097827 with English Translation 9 pages.
Combined Office Action and Search Report dated Apr. 17, 2018 in Taiwanese Patent Application No. 106116208 (w/English translation) 12 pp.
Japanese Office Action dated Aug. 21, 2018 in co-pending Japanese Patent Application No. 2017-097827, filed May 17, 2017 (w/ English translation) 17 pp.
Office Action dated Oct. 1, 2019 in Japanese Patent Application No. 2017-097827.

* cited by examiner

METHODS FOR ADDITIVE FORMATION OF A STT MRAM STACK

PRIORITY CLAIM AND CROSS-REFERENCE

This application is a Continuation of U.S. patent application Ser. No. 15/158,183, filed on May 18, 2016, which is incorporated herein by reference in its entirety.

FIELD OF THE DISCLOSURE

This invention relates to semiconductor processing technology, and more particularly, to methods for forming a metal stacks used to manufacture non-volatile magnetoresistive random-access memory (MRAM) devices on a microelectronic substrate.

BACKGROUND

Minimizing power consumption of electronic devices has long been a desirable goal within the electronics industry. Non-volatile memory devices minimize power consumption by being able to retain stored information when they don't receive power. Magnetoresistive random-access memory (MRAM) devices are one type of non-volatile memory device that enables long-term persistent storage while minimizing power consumption. MRAMs incorporate magnetic storage structures (e.g., Magnetic Tunnel Junctions (MTJ)) with Complementary Metal-Oxide Semiconductor (CMOS) transistors to form addressable read/write storage cells that may be used to store information within an electronic device.

The MTJs enable information to be stored using a magnetic properties of material rather than the materials capacitance properties. An MTJ typically comprises a tunneling barrier layer sandwiched between two ferromagnetic electrodes or metal layers. Accordingly, the MTJ may include conductive metallic layers to generate the magnetic state rather than dielectric layers that have been used in non-MRAM memory devices.

Manufacturing a MTJ using existing CMOS processing techniques has been challenging. In particular, etching multiple layers of different metals has been difficult to control and maintain MTJ performance. For example, etching residue that may be unintentionally deposited across multiple layers of the MTJ and may lead to electrical shorting across the MTJ. Further, etching non-uniformity across the microelectronic substrate may also introduce shorting defects by removing too much of a MTJ layer. Multi-step etching of the multiple metal layers may also introduce unintended sidewall modifications that may degrade MTJ storage capability. In fact, the complex multi-layer stacks of difficult to etch metals has limited the commercial proliferation of MRAM devices within the electronics industry. Accordingly, any MRAM manufacturing techniques that reduce the amount of metal etch process steps may be desirable.

SUMMARY

Disclosed herein are methods for forming a MRAM device (e.g., Spin-Torque Transfer (STT) MRAM) that avoids or minimizes the use of very difficult etch steps by depositing metal layers through a pre-patterned template to form a MTJ structure by skimming away portions of the PVD metal flux that would prevent anisotropic deposition on a underlying substrate.

Broadly, the current MRAM manufacturing schemes may be classified as subtractive techniques that remove portions of the deposited metal layers to form the MTJ of the STT-MRAM device. In contrast, this disclosure describes an additive technique that forms the MTJ cell by depositing the metal layers on top of one another in a anisotropic manner, such that overlap of the metal layers along the MTJ sidewall are minimized to avoid shorting between the metal layers. Additive formation may be enabled by a highly-selective deposition process using existing Physical Vapor Deposition (PVD) techniques coupled with a pre-patterned template that enables a self-collimated and self-aligned formation of the MRAM stack (e.g., MTJ) during the PVD processing.

In brief, the additive formation strategy filters out isotropic characteristics of the PVD techniques by achieving an anisotropic deposition result by skimming away metal ions that would prevent collimated layers from forming on the substrate. The skimming capability may be enabled by depositing metal through a pre-patterned template that skims away or collects non-anisotropic metal ions before they reach the substrate surface. The pre-patterned template is a sacrificial structure that may be removed once the MTJ is formed. Hence, the MTJ cell may be formed without using subtractive processing techniques (e.g., plasma etching). Disclosed herein are methods that may be used to form self-collimated and/or self-aligned MRAM stacks (e.g., MTJs).

In one embodiment, the pre-patterned template may be formed by patterning a multi-layer film stack that is deposited onto the substrate. The film stack may include two or more offset layers that separate at least one aperture layer from other aperture layers and/or the substrate. The offset layers and aperture layer(s) may be two different materials that exhibit different etch rate characteristics, such that the offset layers and the aperture layer(s) can be etched at different rates when exposed to the same etching treatment. For example, the offset layers may comprise a first dielectric material (e.g., silicon oxide, etc.) and the aperture layer(s) may comprise a second dielectric material (e.g., silicon nitride, etc.) that exhibits different etch characteristics than the first dielectric material. In some embodiments, the film stack comprises a total thickness between 300 nm and 1500 nm with the offset layers being between 30 nm and ~1000 nm and the aperture layers having a thickness between 5 nm to 30 nm.

In one specific film stack embodiment, the film stack may include a first aperture layer comprising a thickness between 5 nm and 30 nm disposed on a first offset layer having a thickness between 300 nm and 1000 nm. A second aperture layer disposed in physical contact with the first offset layer, the second aperture layer having a thickness between 5 nm and 30 nm. This film stack may also include a second aperture layer that may be disposed between the first offset layer and a second offset layer that is in contact with the substrate. The second the second aperture layer having a thickness between 5 nm and 30 nm and the second offset layer having a thickness between 20 nm and 50 nm. In other embodiments, the film stack may include additional offset layers (e.g., third offset layer, etc.) and aperture layers (e.g., third aperture layer, etc.) to optimize the uniformity or geometry of the MTJ structure.

Following the deposition of the film stack, a cavity may be formed in the film stack that exposes portion of the underlying substrate, such that the cavity may enable fluid communication between the ambient conditions around the substrate and the exposed surface of the substrate. The cavity may include any type of opening that enables a fluid to pass through the film stack and physically contact the exposed portion of the substrate.

In one particular embodiment, the cavity may include a circular diameter that is common to each layer of the film stack. However, the cavity may be square, rectangular, or oblong depending on the desired geometry of the metal film stack that may be formed on the substrate. For example, in one embodiment, the film stack may be treated to form an annular ring cavity through the film stack, such that the annular ring cavity exposes a portion of the substrate. In this embodiment, the annular ring cavity may be formed to include a first hole diameter(s) for the offset layer(s) and a second hole diameter(s) for the aperture layers, the first hole diameter(s) being larger than the second hole diameter(s). In one instance, the first hole diameters may have a diameter between 30 nm and 50 nm and the second hole diameters may have diameter between 40 nm and 100 nm.

In other embodiments, multiple cavities may be formed at the same time within the film stack with each cavity exposing different portions of the substrate. In this way, the cavities may be arranged to enable the formation of multiple MRAM cells across the substrate. However, in some instances, the formation of the metal stacks within a uniform diameter cavity may have undesirable uniformity effects due to the metal stack sidewall being in contact with the adjacent offset layer. This contact may also be problematic during the pre-patterned template removal process that may damage the sidewall. However, these deficiencies may be remedied by modifying the pre-patterned template cavity to decrease thickness non-uniformity of the metal layers and to separate the metal film stack sidewall from the film stack (e.g., offset layer).

For example, the exposed offset layers within the cavity may be pulled-back, such that the aperture layer extend further into the cavity than the offset layers. The pull-back process may be enabled by a plasma etch process that selectively removes the offset layer(s) without removing a substantial amount of the aperture layer cavity, such that the aperture and offset layers have a greater amount of exposed surface area to skim metal ions being deposited through the pre-patterned template. Another approach to increase the surface area of the cavity may be done by adding another aperture layer to the film stack. In this embodiment, the film stack may include an intermediate aperture layer disposed between the two aperture layers in the previous embodiment. As in the previous embodiment, the pull-back of the offset layers may be done using an etching treatment, such that the cavity now includes two aperture layers protruding from the sidewall into the cavity. Accordingly, in this embodiment, the pre-patterned template provides two skimming surfaces on the aperture layers in addition to the skimming surface of the offset layer that is disposed between the aperture layers.

In another embodiment, the intermediate aperture layer may have a smaller diameter opening or pass-through opening than the aperture layer that is disposed further away from the substrate than the intermediate aperture layer. The larger opening may be enabled by a chemical treatment that removes portions of the intermediate aperture layer at a much slower rate than the top aperture layer(s). In this way, the different openings between the aperture layers increase the anisotropic characteristics of the metal ion flux that passes through the pre-patterned template, such that the metal layer thickness non-uniformity is lower which may improve the metal film stack sidewall profile. In one instance, a desirable sidewall profile may have little or no tapering from top to bottom of the metal film stack. Further, the metal film stack on the substrate may not be in physical contact with the film stack sidewall, such that gap between exists between the metal film stack and the cavity sidewall.

In one embodiment, the metal film stack may comprise at least two different types of metals that may be used to form the MTJ structure that may include, but is not limited to, Ta, Ru, Pt, Co, Fe, Ni, Mg, or any combination thereof. Further, the MTJ structure may also include a barrier layer (e.g., MgO) that may be disposed between two of the metal layers. Following the metal deposition processes, the cavity may be filled or partially filled with a dielectric material (e.g., silicon nitride, oxide, etc.) that may be used to protect the MTJ structure when the pre-patterned template is removed from the substrate. Further, filling in the cavity may prevent non-uniform removal of the pre-patterned template, such that non-uniform removal may damage the MTJ structure or the substrate. The pre-patterned template may be removed using a reactive ion etching treatment, a chemical-mechanical polishing treatment, a wet chemical treatment, or any combination thereof.

This summary is intended to provide an overview of the disclosure and is not intended to limit the scope of the claims to embodiments described above. The embodiments described in the summary are merely for illustrative purposes. For example, the pre-pattern template may be used for forming non-metal layers that may need to have a high degree of uniformity at various regions across the substrate.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

Figure 1:
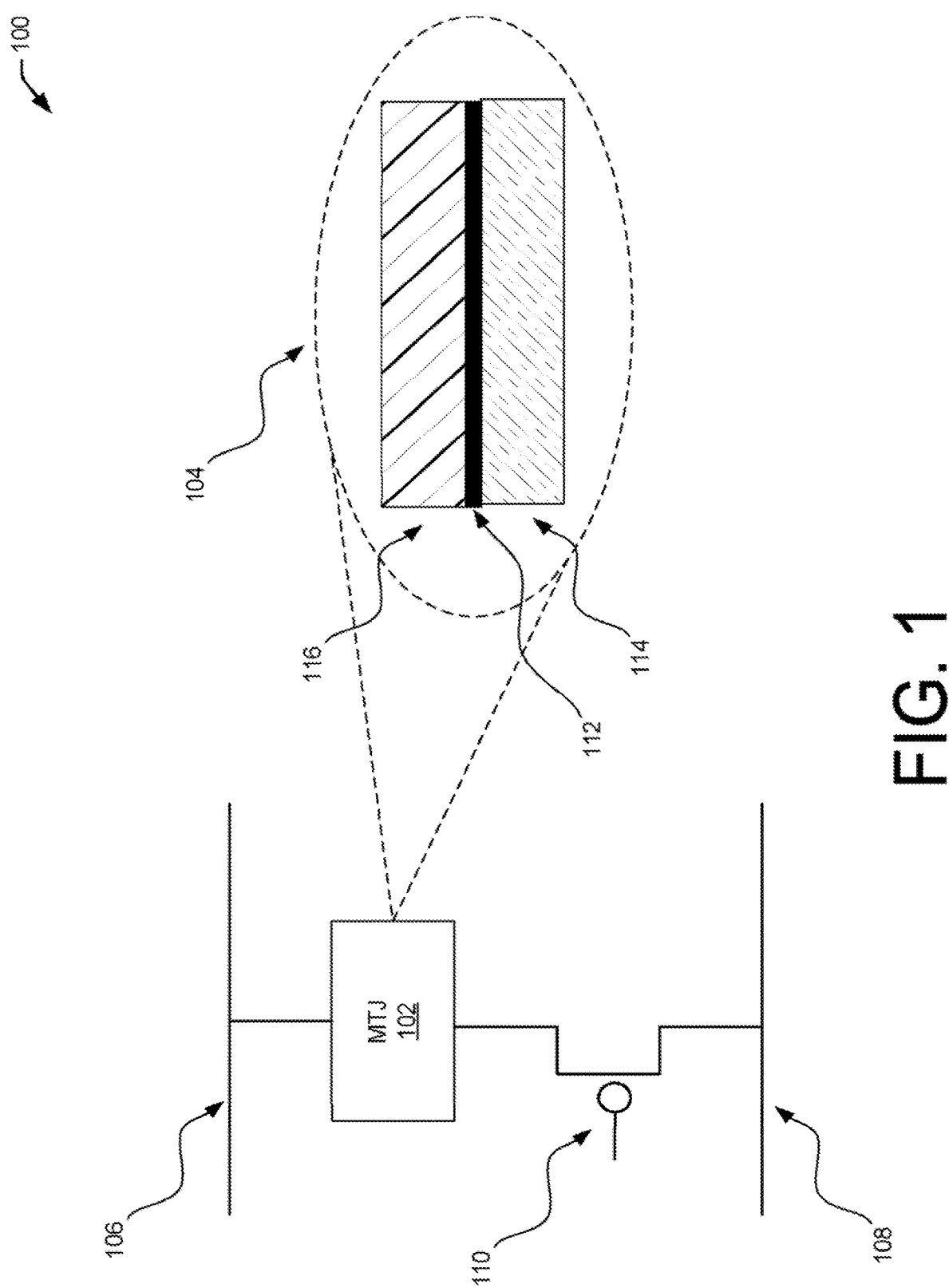
FIG. 1 is a schematic diagram of an MRAM cell and a cross-section illustration of a representative MTJ of the MRAM cell according to at least one embodiment.

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

"Substrate" or "Microelectronic substrate" as used herein generically refers to the object being processed in accordance with the embodiments described herein. The microelectronic substrate may include any material portion or structure of a device, particularly a semiconductor or other electronics device, and may, for example, be a base substrate structure, such as a semiconductor substrate or a layer on or overlying a base substrate structure such as a thin film Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Disclosed herein are apparatuses and methods related to manufacturing an STT-MRAM cell using a novel approach that by-passes traditional metal patterning techniques that include plasma etching of a Metal Tunnel Junction (MTJ) in a MRAM cell or, more particularly, a STT-MRAM cell.

FIG. 1 includes a schematic diagram of a representative MRAM cell 100 that includes a MTJ 102 and a cross-section illustration of a representative MTJ stack 104 of the MRAM cell 100. In most applications, a STT-MRAM memory device (not shown) may include several million MRAM cells 100 that are configured to store information that may be accessed over the bit line 106 and word line 108 using a transistor 110 (e.g., PMOS transistor) to read or write to the MTJ 102. The use of an MTJ device as a memory cell in an MRAM array is described in U.S. Pat. No. 5,640,343. The use of an MTJ 102 as a MR read head has been described in U.S. Pat. Nos. 5,390,061; 5,650,958; 5,729,410 and 5,764,567.

STT-MRAMS are well known within the microelectronics field and the MTJ stack 104 merely illustrates one embodiment of possible MTJs 102 that may be incorporated into microelectronic devices. Broadly, the MTJ stack 104 may include a tunnel or barrier layer 112 disposed between a fixed layer 114 portion and free layer 116 portion. The fixed layer 114 portion and the free layer 116 portion may include one or more ferromagnetic layers that each exhibit certain magnetic properties that may be used to store a bit of information. The ferromagnetic layers of each portion of the MTJ stack 104 may be configured to collaborate, such that the MTJ 102 may be toggled between two different states (e.g., 0 or 1) based, at least in part, on the magnetic characteristics (e.g., magnetic moment) of each portion of the MTJ stack 104. The magnetic moment may be expressed as a vector that has magnitude and direction that provides an indication of the how each portion may respond to an externally applied magnetic field. A person of ordinary skill in the art of MRAM technology may optimize or alter the magnetic moments of the MTJ stack 104 layers to enable a switch that may be toggled between an "on" or "off" state.

In one embodiment, the fixed layer 114 may operate as a reference to compare against the free layer 116. The fixed layer may be fixed or pinned such that it's magnetic moment is unaffected by the presence of magnetic fields applied to the MRAM device. This may be done by using highly coercive magnetic material or by exchange coupling to an antiferromagnetic layer. In contrast, the magnetic moment of the free layer 116 may respond to applied magnetic fields, such that the free layer 116 magnetic moment may be parallel (P) or anti-parallel (AP) to the magnetic moment of the fixed layer 114. For example, the write current applied to the MTJ 102 may generate a magnetic field that may be able to change the magnetic moment of the free layer 116 without changing the magnetic moment of the fixed layer 114. In this way, the MTJ 102 may store a bit of information that is highly persistent even when power is not applied to the MRAM device. The free layer 116 and the fixed layer 114 may include one or more types of metal layers that may be arranged to obtain their respective magnetic moment characteristics described above. The metal layers may include, but are not limited to, Ta, Ru, Pt, Co, Fe. Ni, Mg, or any combination thereof.

The tunnel layer 112 disposed between the fixed layer 114 and the free layer 116 may include an insulating material that acts a tunneling barrier for electrons that enables the MTJ 102 to be toggled between two states of electrical resistance. Generally, the tunnel layer 112 may include a metal oxide such as MgO, ZnO, or Ah03.

Although MTJ 102 devices may be well-known in the art, the issues with manufacturing a MTJ stack 104 are problematic from a cost and performance standpoint that has limited the commercialization of MRAM over dielectric cell designs in other memory devices (e.g., FLASH, DRAM).

For instance, conventional deposition/etching approaches are difficult to execute and may introduce unintended defects that degrade MRAM device performance. For example, etching residue that may be unintentionally deposited across multiple layers of the MTJ stack 104 and may lead to electrical shorting across the MTJ 102. Further, etching non-uniformity across the microelectronic substrate may also introduce shorting defects by removing too much of a MTJ layer, such that metal layers from the fixed layer 114 and free layer 116 may overlap. Multi-step etching of the multiple metal layers may also introduce unintended sidewall modifications that may degrade storage capability. Hence, circumventing the typical MRAM etch processes while still being able to form the MTJ stack 104 may be desirable.

Figure 2:
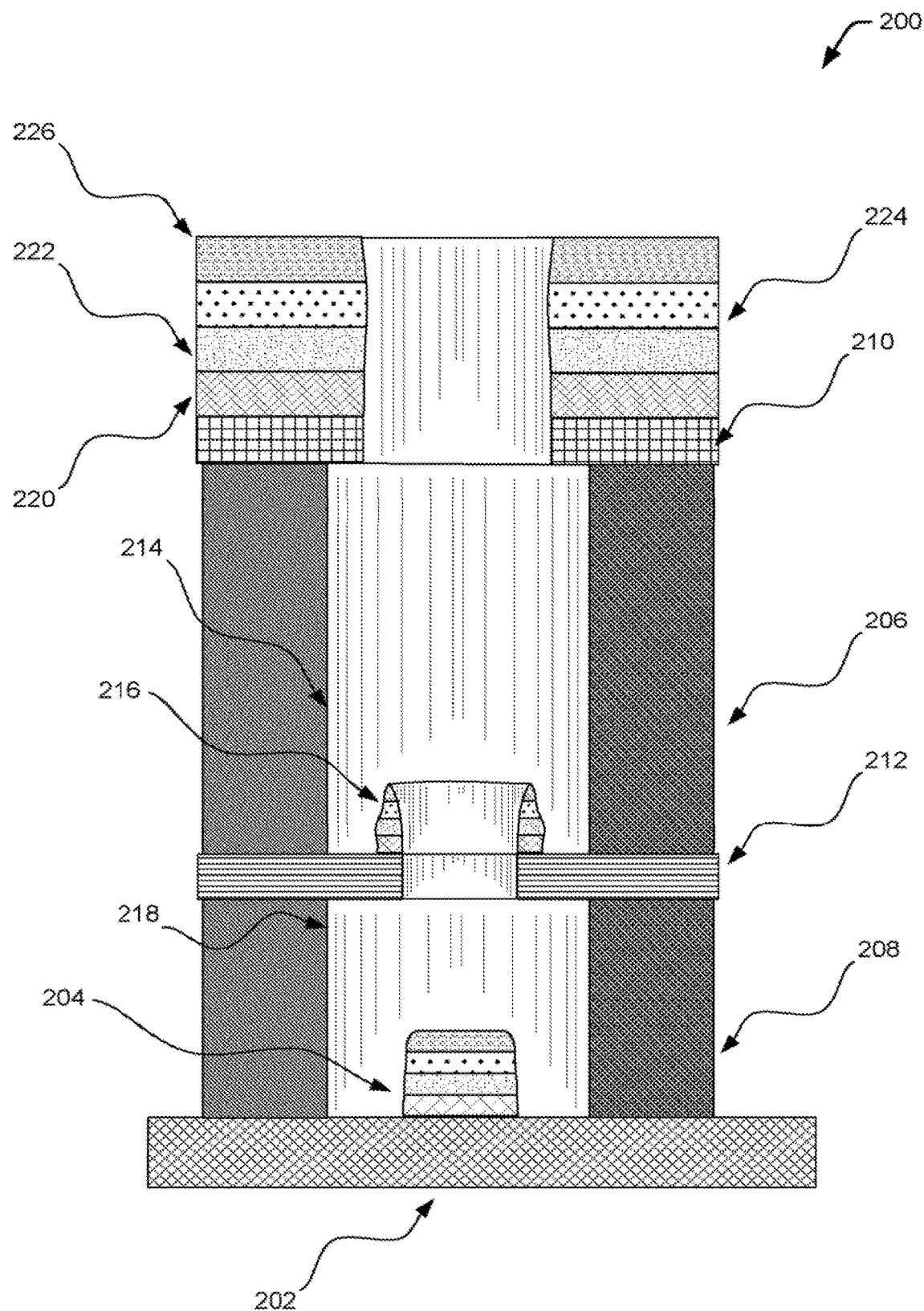
FIG. 2 is a cross-section 3-D illustration of a pre-patterned template structure that may be used to form metal layers for the representative MTJ of FIG. 1 according to at least one embodiment.

In one embodiment, the metal layer deposition may be performed through a pre-patterned template (not shown) or structure that skims or transitions the metal deposition process from an isotropic process to an anisotropic process that uniformly deposits the MTJ stack 104 with a desirable metal layer thickness uniformity and sidewall profile. Ideally, the metal layer thickness non-uniformity would be low enough to prevent shorts between the metal layers near the edge of the MTJ stack 104. In short, the pre-patterned template may skim metal ions along its surface to prevent non-uniform deposition of the metal layers on the substrate. FIG. 2 includes a cross-section 3-D illustration of a pre-patterned template structure in which several metal layers have been deposited through to form the MTJ stack 104.

FIG. 2 includes a cross-section illustration of a metal covered pre-patterned template 200 that includes several metal layers deposited through the pre-patterned template 200 using known Physical Vapor Deposition (PVD) techniques. The FIG. 2 embodiment represents a single portion of the pre-patterned template 200 for the purposes of ease of explanation and not limitation. The pre-patterned template 200 may include other similarly or differently sized portions depending on the design of the MRAM array. In this embodiment, the pre-patterned template 200 may be formed a on a substrate 202 which may include any semiconductor material that may also include transistors that may interface with the metal stack 204.

The pre-patterned template 200 may include several different types of films that may be chosen based, at least in part, on their etch selectivity with respect to each other to enable the formation of the structure prior to metallization. For example, the ability to selectively etch each film layer may enable a person of ordinary skill in the art to form the pre-patterned template 200 from blanket depositions of different films. In this embodiment, the offset layers (e.g., first offset layer 206, second offset layer 208) and the aperture layers (e.g., first aperture layer 210, second aperture layer 212) may be deposited as blanket films on top of each other with varying thicknesses, which will be described in greater detail in the description of the remaining figures. The multi-layer film stack may be etched to form a cavity that exposes the surface of the substrate where the metal stack 204 will be deposited. The cavity may enable fluid communication between the top of the film stack and the exposed portion of the substrate 202. In one embodiment, the offset layers may include a silicon oxide film and the aperture layer may include a silicon nitride film Next, another etch process may be used to selectively etch the exposed sidewall portions of the offset layers (e.g., oxide) within the cavity with very little or no removal of the aperture layers (e.g., silicon nitride). In this way, the offset layers may have a relatively larger volume or diameter that increases the amount of surface area to skim metal ions that enter into the cavity through the opening in the first aperture layer 210. Also, the larger cavity near the exposed substrate surface may also prevent physical contact between the second offset layer 210 and the metal stack 204. Ideally, anisotropic deposition of the metal stack 204 will be achieved by the skimming away isotropic metal ions that would not enable a collimated formation of the metal stack 204 before the isotropic metal ions reach the substrate 202.

In this embodiment, the metal layers (e.g., first metal layer 220, second metal layer 222, third metal layer 224, fourth metal layer 226) may be deposited using known PVD or CVD techniques. Generally, PVD/CVD deposition is highly isotropic, such the metal ions may be directed in any direction within the process chamber. Ideally, the pre-patterned template 200 would bring a degree of directionality to the metal ions as they pass through the openings of the aperture layers 210, 212. For example, the surface of the first aperture layer 210 will be the first skimming surface that skims away metal ions that are less likely to enable anisotropic deposition. The isotropic metal ions that pass through the opening may also be skimmed by the first offset layer 206 sidewall 214 that are not likely to enable anisotropic deposition, despite having made it through the first aperture layer 210 opening. Further, the second aperture layer 212 may also skim additional isotropic metal ions that are not likely to enable anisotropic deposition. Accordingly, a metal skim layer 216 may be formed on the surface around the opening in the second aperture layer 212. In this way, metal ions are that are most likely to enable anisotropic deposition on the substrate 202 may pass through the aperture layer 212 opening and be deposited on the exposed substrate 202 without physical contact between the second offset layer 208 sidewall 218.

Figure 5:
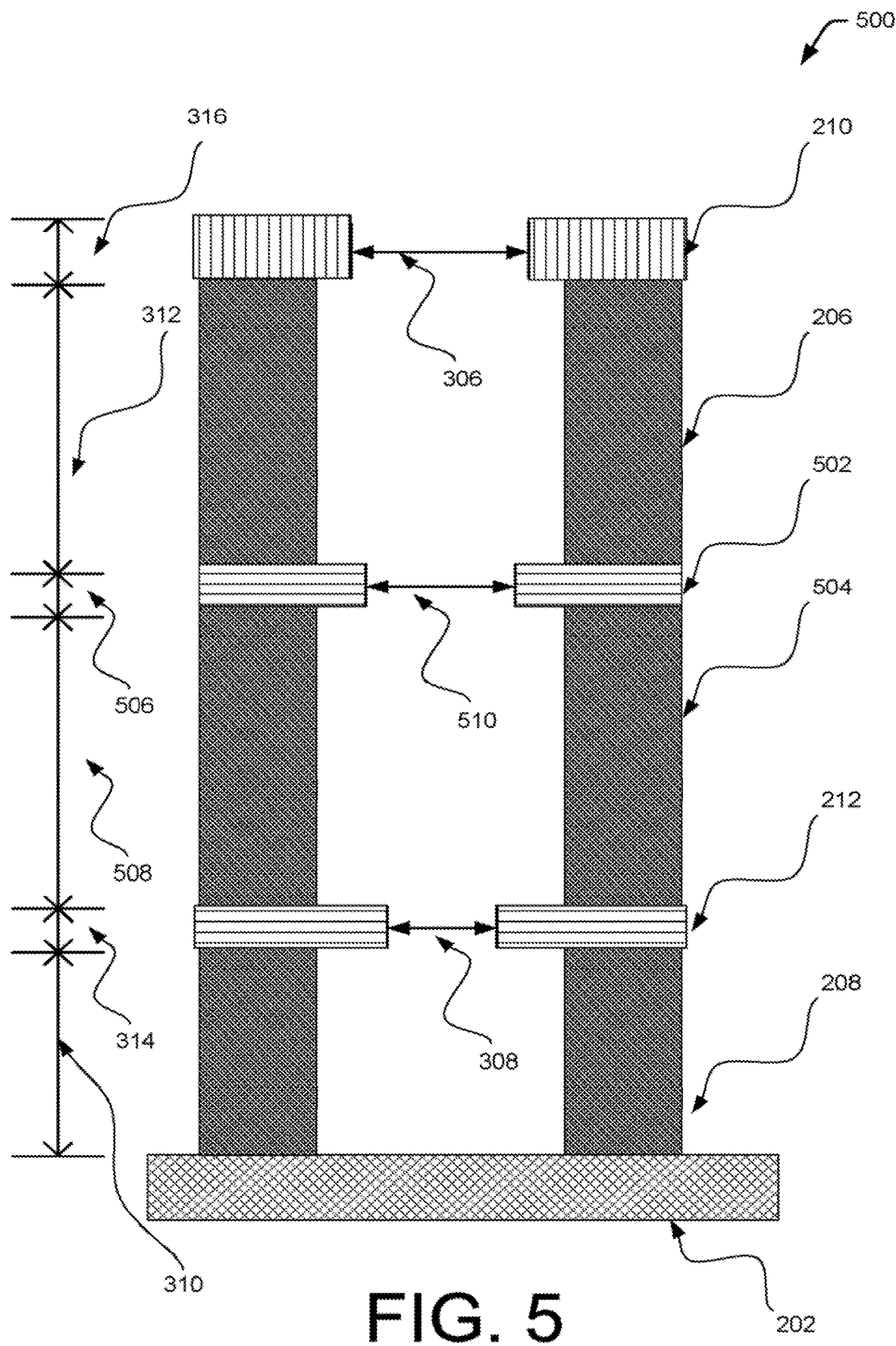
FIG. 5 is a side-view cross-section illustration of another embodiment of the pre-patterned template that incorporates additional layers and skimming surfaces to form another embodiment of a skimming conduits that enables the formation of a MTJ cell on a substrate according to at least one embodiment.

The dimensions of the pre-patterned template 200 may be optimized to target desirable metal stack 204 uniformity and sidewall profiles. The thicknesses of the offset layers 208, 210, the aperture layer 212, 214, and/or the geometry of the aperture layer 210, 212 may be varied to achieve the desired uniformity of the metal stack 204 and/or electrical characteristics of the MTJ 102. For example, in some embodiments, the second etch process may also be used to widen the opening of the first aperture layer 210 so that it is larger than the opening in the second aperture layer 212. However, in some embodiments, a third etch process may be used to increase the size of the opening in the first aperture layer 210. Further, additional offset and aperture layers may also be added to the pre-patterned template as shown in FIG. 5. These embodiments will be described in greater detail in the description of the remaining figures.

Figure 3:
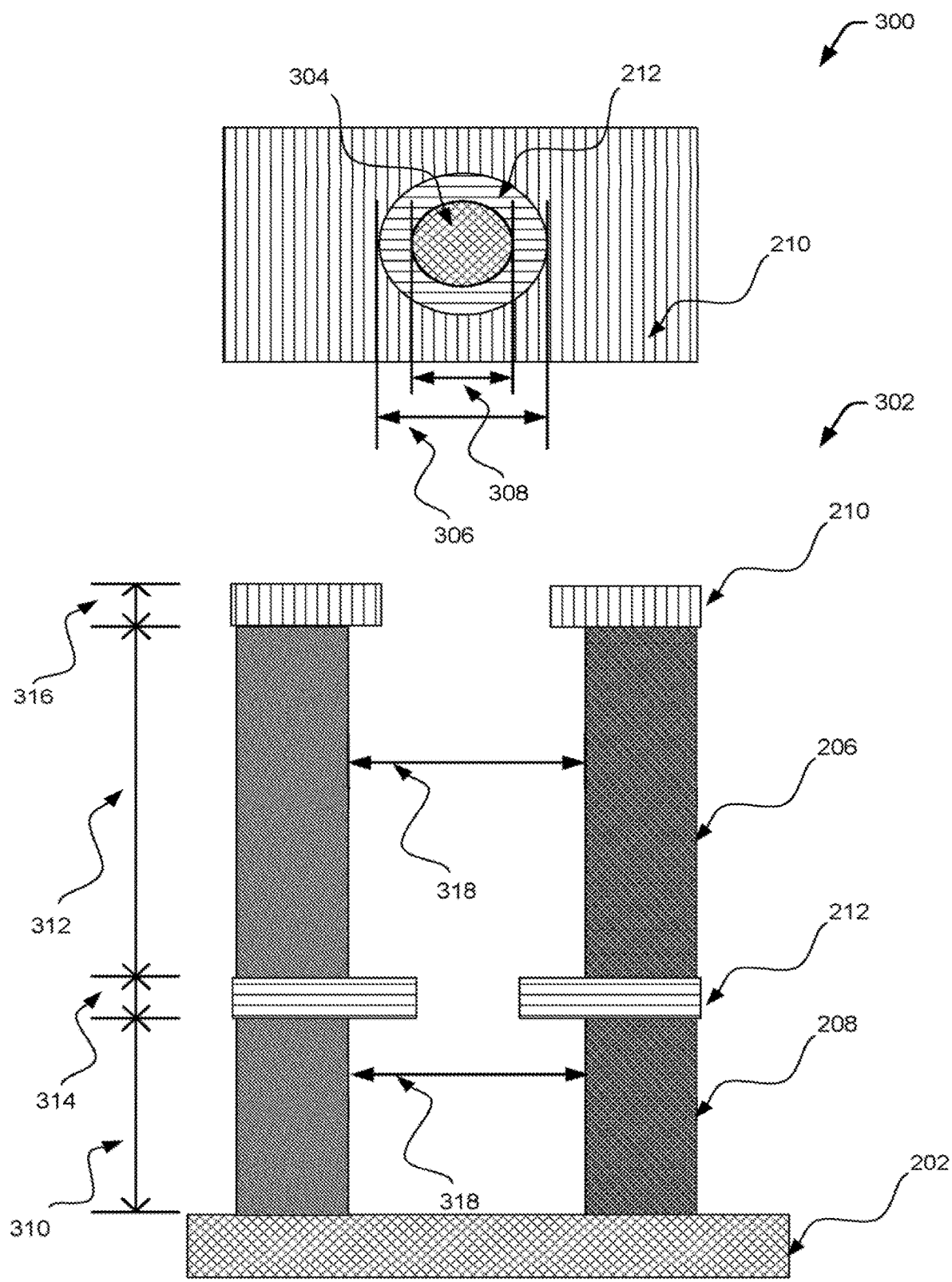
FIG. 3 is a side-view cross-section illustration and a top-view illustration of the pre-patterned template skims metal ions to enable the formation of a uniform and stand-alone MTJ cell according to at least one embodiment.

Turning now to FIG. 3, one embodiment of the pre-patterned template 200 is shown in a top-view illustration 300 along with a side-view cross-section illustration 302 intended to highlight the dimensions that may be optimized to achieve the desired MTJ 102 performance for an MRAM device. The metal ion flux through the pre-patterned template 200 may be skimmed to enable anisotropic or collimated deposition on the substrate 202. However, the deposition material may not be limited to the metal films shown in FIGS. 1 and 2. The pre-patterned template 200 may be used to enable any collimated or anisotropic deposition of any material.

In this embodiment, the top view 300 illustrates the arrangement of the openings when the film stack exposes the surface 304 of the substrate 202. During metal deposition, a portion of the metal ions may pass through a first aperture layer opening 306 and either pass through the second aperture layer opening 308 or be deposited on the first offset layer sidewall 214 or the surface of exposed surface of the second aperture layer 212, as shown in FIG. 2. Ideally, metal ions that will not enable anisotropic deposition will be skimmed or deposited on the pre-patterned template 200 and not pass through the second aperture layer opening 308. The composition and dimensions (e.g., thickness) of the multi-layer film stack in combination with the opening and cavity dimensions may vary depending on the desired uniformity of the material being deposited on the substrate 202. For example, the diameter of the second aperture layer opening 308 is slightly smaller than the first aperture layer opening 306 to enable a higher removal rate of non-anisotropic metal ions. Further, the distance between the aperture layers 206, 208 may vary, as well as the distance between the second aperture layer 208 and the substrate 202.

In the FIG. 3 embodiment, the film stack composition includes alternating layers of two different materials that have sufficient etch selectivity differences that enable a person of ordinary skill in the art to use an etch processes that expose the substrate 202 as shown in the top-view illustration 300 and enable the selective removal of the offset layers 206, 208 to expose at least the second aperture layer 212, such that the second aperture layer 212 protrudes into the cavity, as shown in the side-view cross-section illustration 302.

In one set of embodiments, the combined thickness of the film stack may range between 300 nm and 1000 nm and the individual layer thicknesses may vary within that framework depending on the application. However, in some metal deposition embodiments, the metal stack 204 has been shown to have higher uniformity and sharper sidewall profiles when second aperture layer 212 is closer to the substrate 202 than to the first aperture layer 210. The shorter distance between the second aperture layer 212 and the substrate 202 increases the probability of anisotropic deposition on the substrate 202 by limiting how far the metal ion has to travel before reaching the substrate 202. The shorter distance between the second aperture layer 212 funnels the metal ions into a collimated layer. In contrast, the larger distance between the first aperture layer 210 and the second aperture layer 212 increases the amount of surface that can be used skim metal ions that may not contribute to anisotropic deposition at the substrate 202. Further, the non-ideal metal ions will be deposited on the first offset layer 206 sidewall or skimmed away by the second aperture layer 212. Accordingly, a person of ordinary skill in the art could optimize the dimensions of the pre-patterned stack 200 to achieve desired thickness and uniformity for the MTJ 102 or other structure comprises of multiple film layers.

In most metal deposition embodiments, the second offset layer thickness 310 may range between 30 nm to 50 nm for metal stack 204 thicknesses between 15-30 nm. The corresponding first offset layer thickness 312 may range between 200 nm to 1000 nm. The first aperture layer 210 and the second aperture layer 212 may vary between 10 nm and 30 nm depending on the application. Although FIG. 3 suggests that the first aperture layer 210 and the second aperture layer 212 have the same thickness, it is not required. Likewise, the diameter or size of the aperture layer 210, 212 openings may be the same size, but they are not required to be the same. In an annular cavity embodiment, the aperture layer 210, 212 openings may vary in diameter between 30 nm and 60 nm. In the FIG. 3 embodiment, the first aperture layer opening 306 may be about 50 nm and the second aperture layer opening 308 may be about 30 nm. In other embodiments, the first aperture layer opening 306 may range between 40 nm to 60 nm and the second aperture layer opening may be up to 20 nm smaller in size than the first aperture layer opening 306.

Another aspect of the pre-patterned template 200, is the difference in diameter or opening size between the offset layers and the aperture layers. A selective etch process may be used to remove more of the offset layer from the cavity than the aperture layers, such that the aperture layers may protrude into the cavity and the offset layer may have a higher surface area after the pull-back etch process. The pull-back distance of the offset layers may be optimized to insure sufficient surface area to capture or skim the metal flux through the pre-patterned template 200 to prevent obstruction of the aperture layer openings.

In the annular cavity embodiments (e.g., FIG. 3), the pull-back distance 318 may range between 70 nm and 100 nm between the sidewalls of the offset layer 206, 208 cavities. However, this distance may vary depending on the geometry of the openings. Generally, the longest pull-back distance within the offset layer cavity 206, 208 may be no more than 40% greater than the largest size of the opening in the first offset layer 206. Although the FIG. 3 embodiment illustrates an annular-cavity design, the pre-patterned template 200 is not limited to circular cavities, in fact the cavities may be rectangular, square, oblong, or any other geometry that may be used form the MTJ 102 for any MRAM device. Also, in most embodiments, the pre-patterned template 200 may be patterned to enable an array of MTJs 102 across the substrate 202, as shown in FIG. 4.

Figure 4:
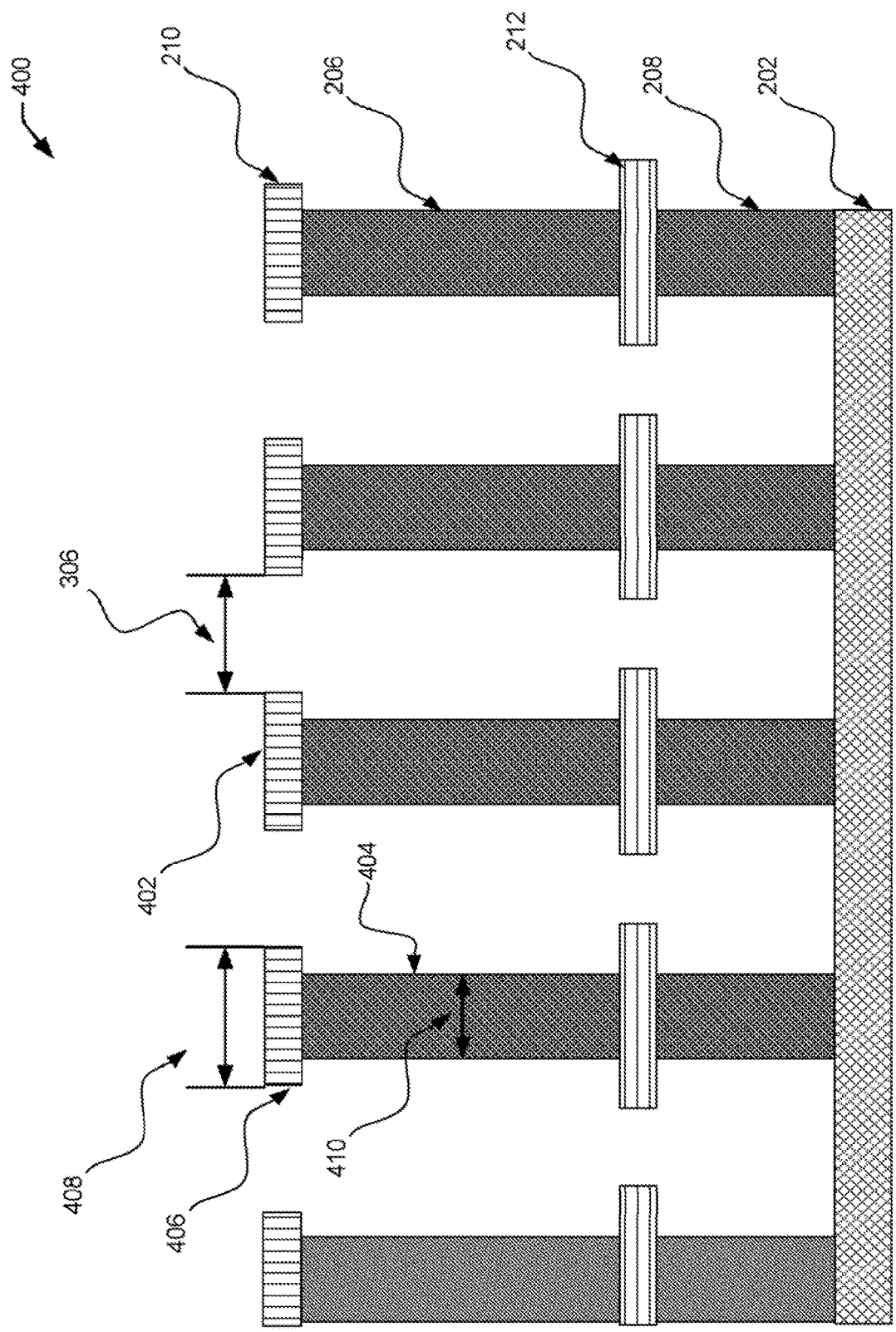
FIG. 4 is a side-view cross-section illustration of the pre-patterned template that incorporates a plurality of metal skimming conduits that may be able to form a plurality of skims metal ions to enable the formation of a plurality of MTJ cells on a substrate according to at least one embodiment.

FIG. 4 includes a side-view cross-section illustration of an array-patterned template 400 that incorporates a plurality of metal skimming channels that may be used to form an array of MTJs 102 on the substrate 202. The array-patterned template 400 may be formed using the same techniques as the pre-patterned array 200, except that the distance between each skimming channel may vary, as needed, and may follow a set of design rules that enables each of the skimming channels to support itself and any deposited films.

The design rules for the array-patterned template 400 may include, but are not limited to, the size of the cap layer 402, particularly the surface that is exposed directly to the PVD metal flux and acts as the initial skimming layer. Likewise, the size of the offset support 404 that is under the cap layer 402 should be strong enough to support the cap layer during deposition or when the substrate 202 is moved during the manufacturing process.

In the annular ring cavity embodiment, the distance across of the cap layer 402 will be no less than the largest distance of the first aperture layer opening 306. For example, in one specific embodiment, when the first aperture layer opening 306 may be 50 nm an adjacent cap layer 406 should be at least 50 nm away (e.g., cap length 408) from the closest feature of the adjacent opening. Likewise, the smallest length (e.g., support length 410) of the offset support 404 should be no more than less than 40% of the length of the cap layer 402.

Other cavity embodiments may include, but are not limited to, rectangular, square, oblong, or any other patterned shape used to form a metal stack 204 on the substrate 202. The dimensions of the array-patterned template 400 for these other embodiments may be optimized by a person of ordinary skill in the art to enable the formation of uniform layers on the substrate 202.

In other embodiments, the pre-patterned template 200 may include more than two aperture layers 210, 212 which may increase the removal of the isotropic metal ions from the PVD metal flux to improve the metal stack 204 uniformity and sidewall profile.

FIG. 5 includes a side-view cross-section illustration of another embodiment of the pre-patterned template 200 that incorporates additional layers and skimming surfaces to form a pre-patterned lensing template 500. The additional aperture layer(s) (e.g., third aperture layer 502) provides another skimming surface that extends into the PVD metal flux to filter out additional isotropic metal ions that were not deposited on the first aperture layer 210 or the first offset layer 206. In theory, the additional skimming should decrease the amount of isotropic metal ions that reach the substrate 202.

In the FIG. 5 embodiment, the third aperture layer 502 and the underlying third offset layer 504 may be inserted between the first offset layer 206 and the second aperture layer 212. The third aperture layer opening 510 may have the same dimensions as the first aperture layer opening 306 or the a second aperture layer opening 308 as described in the description of FIG. 3. However, the third aperture layer opening 510 may also be smaller than the first aperture layer opening 306 and lager than second aperture layer opening 308. Hence, the third aperture layer opening 510 may range between 20 nm and 50 nm. In this embodiment, the thickness of the third aperture layer 502 may vary between 10 nm and 20 nm and the third offset layer thickness 508 may vary between 50 nm and 800 nm.

In one specific annular-cavity embodiment, the third aperture opening 510 may have a diameter of about 40 nm, while the first aperture opening 306 may have a diameter of about 50 nm and the second aperture opening 308 may have a diameter of about 30 nm. In this way, the aperture layers 306, 308, 510 may form an annular-ring cavity with a decreasing effective diameter for the PVD metal ion flux that's used to form the MTJ 102. In this embodiment, the offset layers 206, 208, 504 may also decrease in size the closer they are to the substrate 202. For example, the first offset layer 206 may be about 200 nm, the second offset layer 208 may be about 50 nm, and the third offset layer 508 may be about 100 nm. However, the thicknesses, lengths, widths, and opening sizes of the pre-patterned lensing template 500 may be varied to obtain the desired metal thickness uniformity of the MTJ stack 104. A person of ordinary skill in the art may use the embodiments disclosed herein to vary the pre-patterned lensing template 500 dimensions as needed, including using dimensions not disclosed herein.

Figure 6A:
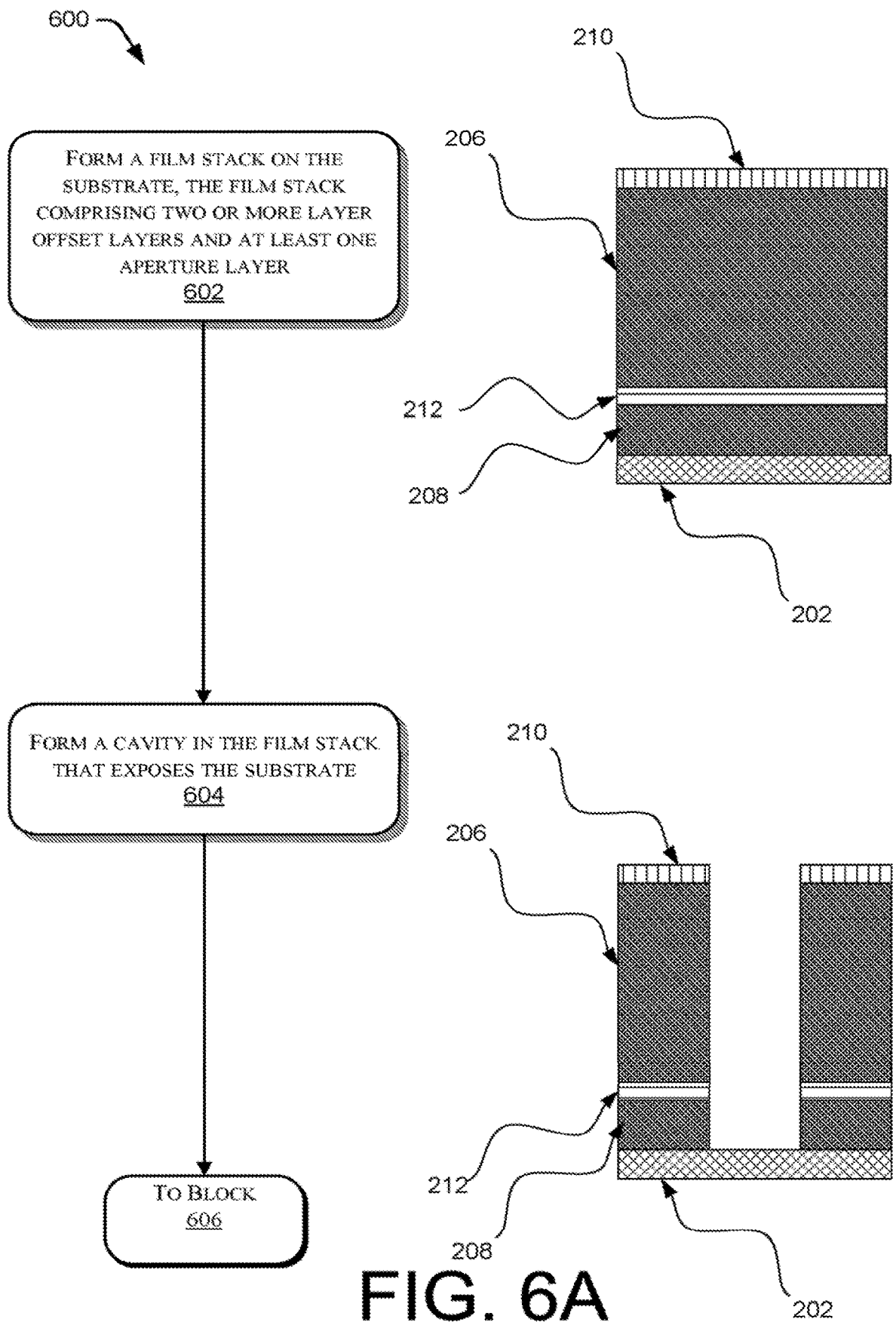
FIGS. 6A-6B is a flow diagram for method for generating a pre-patterned template that may be used to form an MTJ cell on a substrate, including representative cross-section illustrations of the pre-patterned template during the implementation of the method of the substrate, according to at least one embodiment.
Figure 6B:
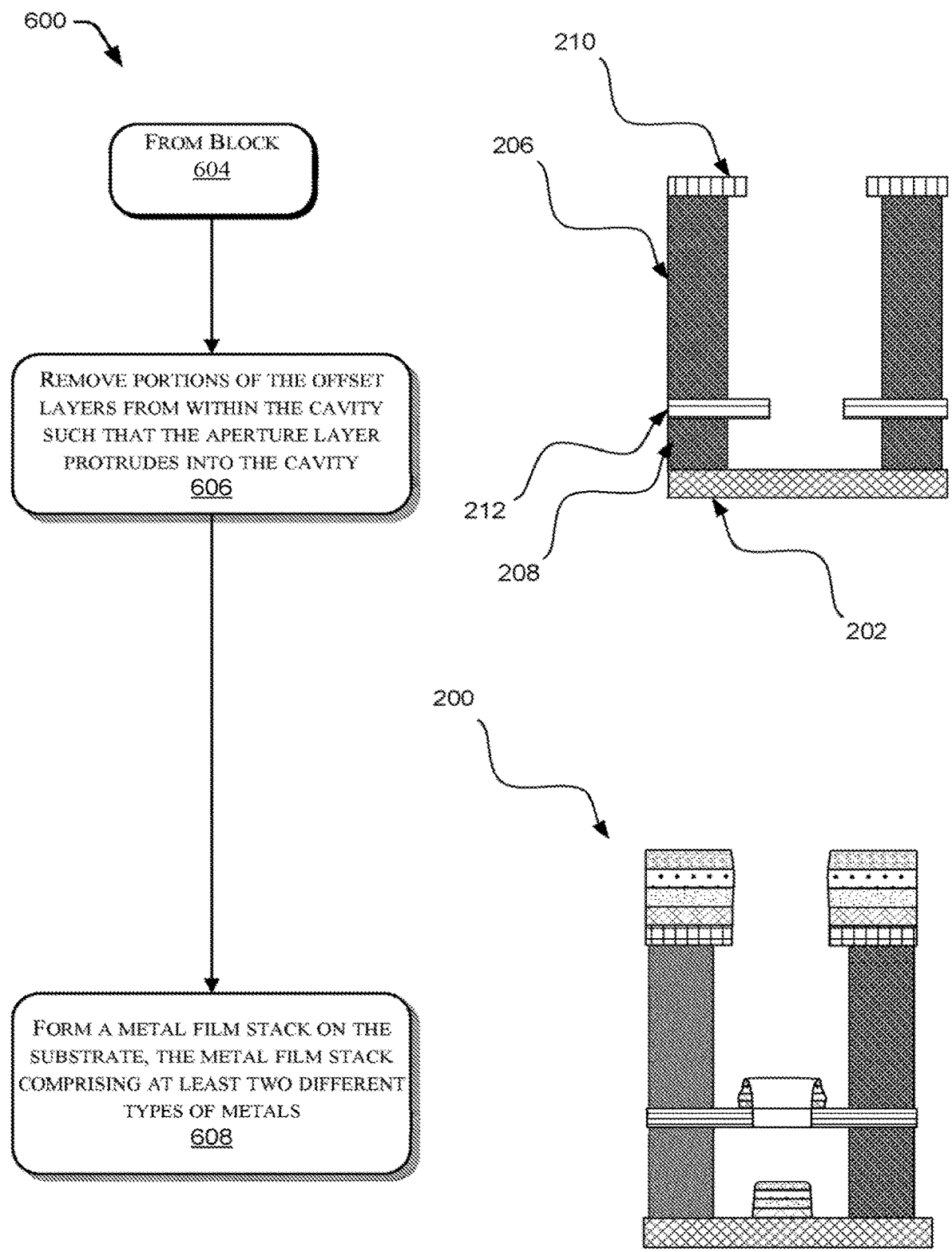

FIGS. 6A-6B includes a flow diagram 600 for a method for generating a pre-patterned template 200 that may be used to form an MTJ 102 cell on a substrate 202, including representative cross-section illustrations of the pre-patterned template during the implementation of the method on the substrate 202. The methods disclosed herein may be implemented using a combination of semiconductor process techniques that may include, but are not limited to, deposition and patterning techniques known to a person of ordinary skill in the art of semiconductor processing. However, novel combinations of these techniques may be used to form the pre-patterned template 200.

In one embodiment, the pre-patterned template 200 may be formed by patterning a multi-layer film stack that is deposited onto the substrate 202. The film stack may include two or more offset layers that separate at least one aperture layer from other aperture layers and/or the substrate 202. The offset layers and aperture layer(s) may be two different materials that exhibit different etch rate characteristics, such that the offset layers and the aperture layer(s) can be etched at different rates when exposed to the same etching treatment. For example, the offset layers may comprise a first dielectric material (e.g., silicon oxide, etc.) and the aperture layer(s) may comprise a second dielectric material (e.g., silicon nitride, etc.) that is different from the first dielectric material composition.

At block 602, a film stack may be formed on the substrate 202 that may include two or more blanket deposited layers that may be patterned and etched to form the pre-patterned template 200. The film stack may include, but is not limited to, alternating layers of a first dielectric material composition and a second dielectric material composition that is different from the first dielectric material composition. The dielectric materials may be selected based, at least in part, on their ability to be selectively etched with respect to each other when exposed to different plasma chemistries. Additionally, the selected materials should be able to be uniformly deposited across the substrate 202 and have sufficient adhesive properties to remain contact with each other after being deposited on the substrate 202. In one specific embodiment, the first dielectric material may be silicon oxide that may be used to form the offset layers and the second dielectric material may be silicon nitride that may be used form the aperture layers.

The offset and aperture layers may be deposited using CVD techniques known to a person of ordinary skill in the art of semiconductor processing. As noted in the description of FIG. 3, the offset and aperture layers may be deposited to form the films stack that may have ranging between 30 nm and up to 1000 nm depending on the design of the pre-patterned template 200. In one embodiment, the silicon oxide may be deposited using any plasma-enhanced chemical vapor deposition (PECVD) techniques that may include, but is not limited to, High Density Plasma (HDP) and Electron Cyclotron Resonance (ECR) that occur at relatively low pressure using a tetraethylorthosilicate (TEOS) precursor to deposit the silicon oxide. The silicon nitride layer may also be deposited using a PECVD process that uses a dichlorosilane (DCS) and NH 3 chemistry to deposit silicon nitride on the silicon oxide layers.

At block 604, a cavity may be etched into the film stack that exposes the underlying substrate 202, such that there fluid communication may exist between the opening of the film stack through the cavity to the surface of the substrate 202. Fluid communication mn means that a fluid should be able to pass through the film stack and reach the surface of the substrate 202. This could also mean that a fluid path is available for a fluid to move through the openings of the offset layers and aperture layers to reach the substrate 202, such a metal ion flux or additional etch chemistries may pass through the cavity in the film stack through and reach the substrate 202.

The cavity may be formed by patterning the film stack using known photolithography techniques to form a mask for a desired geometry of the cavity that may be etched through to remove portions of the films stack until the substrate 202 is exposed. In one embodiment, the silicon oxide and silicon nitride layers may be etched using a plasma chemistry that may include a fluorocarbon (e.g., CF4) or hydrofluorocarbon (e.g., CHF3). A person of ordinary skill in the art would be able to optimize the cavity etch process to generate a relatively uniform sidewall along the film stack, such that the silicon oxide and silicon nitride layers are relatively flush to each other along the cavity sidewall, as shown in the illustration to right of block 604 in FIG. 6.

At block 606, the pre-patterned template 302 may be formed by selectively removing portions of the offset layers (e.g., first offset layer 206, second offset layer 208) from within the cavity, such that the aperture layers (e.g., first aperture layer 210, second aperture layer 212) protrude into the cavity, as shown in FIG. 3. The selective removal of the offset layers may be enabled by a plasma process where the offset layers have a higher etch rate relative to the aperture layers. A person of ordinary skill in the art may optimize dielectric etch techniques to enable the offset layer pull back shown in FIG. 3. For example, in one embodiment, the selective removal of the offset layers may be enabled by using a plasma chemistry that includes a fluorocarbon chemistry.

In another embodiment, the removing of the offset layers may also include removing portions of the first aperture layer 210 at a higher rate than the second aperture layer 212, such that the opening in the first aperture layer 210 is larger than the opening in the second aperture layer 212. The higher rate of removal of the first aperture layer 210 may be enabled by transitioning the offset layer removal process to a higher power. A person of ordinary skill in the art may optimize the power to remove portions of the first aperture layer 210 at a higher rate than the second aperture layer 212. Hence, the first aperture layer 210 may have a larger opening or diameter than the second aperture layer 212.

A person of ordinary skill in the art could optimize the aforementioned processes in flow diagram 600 to generate a pre-patterned template 200, array-patterned template 400, or a pre-patterned lensing template 500 that enables the formation of a desirable MTJ 104 by depositing metal and barrier layers through any of the templates disclosed herein.

At block 608, the MTJ stack 104 may be formed on the substrate 202 by depositing metal through the pre-patterned template 200 towards the substrate 202. Generally, the MTJ stack 104 may include at least two different types of metals that may include, but are not limited to, Ta, Ru, Pt, Co. Fe, Ni. Mg, or any combination thereof. The metal film stack may also include a barrier layer 112 disposed within the metal stack 204. The metal layers may be selected and arranged to form the free layer 114 and fixed layer 116, such that the MTJ 104 may operate as a MRAM cell within an MRAM memory device. A person of ordinary skill in the art may arrange the metal layer compositions and thicknesses needed to enable an operating MRAM cell, as shown in FIG. 1.

In this embodiment, the pre-patterned template 200 may skim the metal fluxes applied to the substrate 202 which enable the MTJ stack 104 to be formed, such that the sidewall of the second offset layer 208 is not touching the MTJ stack 104 and that the MTJ 104 metal layers have a non-uniformity of no more than 2%.

Following the formation of the MTJ 104, the pre-patterned template 200 may be removed from the substrate 202 that will continue on for subsequent processing to finalize the formation of the MRAM cell 100. Ideally, the removal process should minimize any damage to the MTJ 104 and the substrate 202. Under one embodiment, a fill layer may be used to fill the cavity to enable a more uniform removal of the pre-patterned template 200. The fill layer may include any material (e.g., silicon oxide) that can conformally fill the cavity and has similar etch characteristics to one or more of the materials used in the pre-patterned template 200. In one embodiment, the fill layer may be silicon oxide that may be the same as or similar to the offset layer material. Further, prior to depositing the fill layer, a protective layer may also be deposited on the MTJ 104 to prevent damage caused by the removal of the pre-patterned template 202. Hence, enabling more aggressive removal processes for the pre-patterned template 200 without damaging the MTJ 104. The protective layer may have relatively low selectivity to the offset layer, but relatively high selectivity to the MTJ 104 layers. In one specific embodiment, the protective layer may include, but is not limited to, TEOS or silicon oxide. The pre-patterned template 200 may be removed using a dry etch, wet etch, a mechanical polish, or any combination thereof.

Figure 7A:
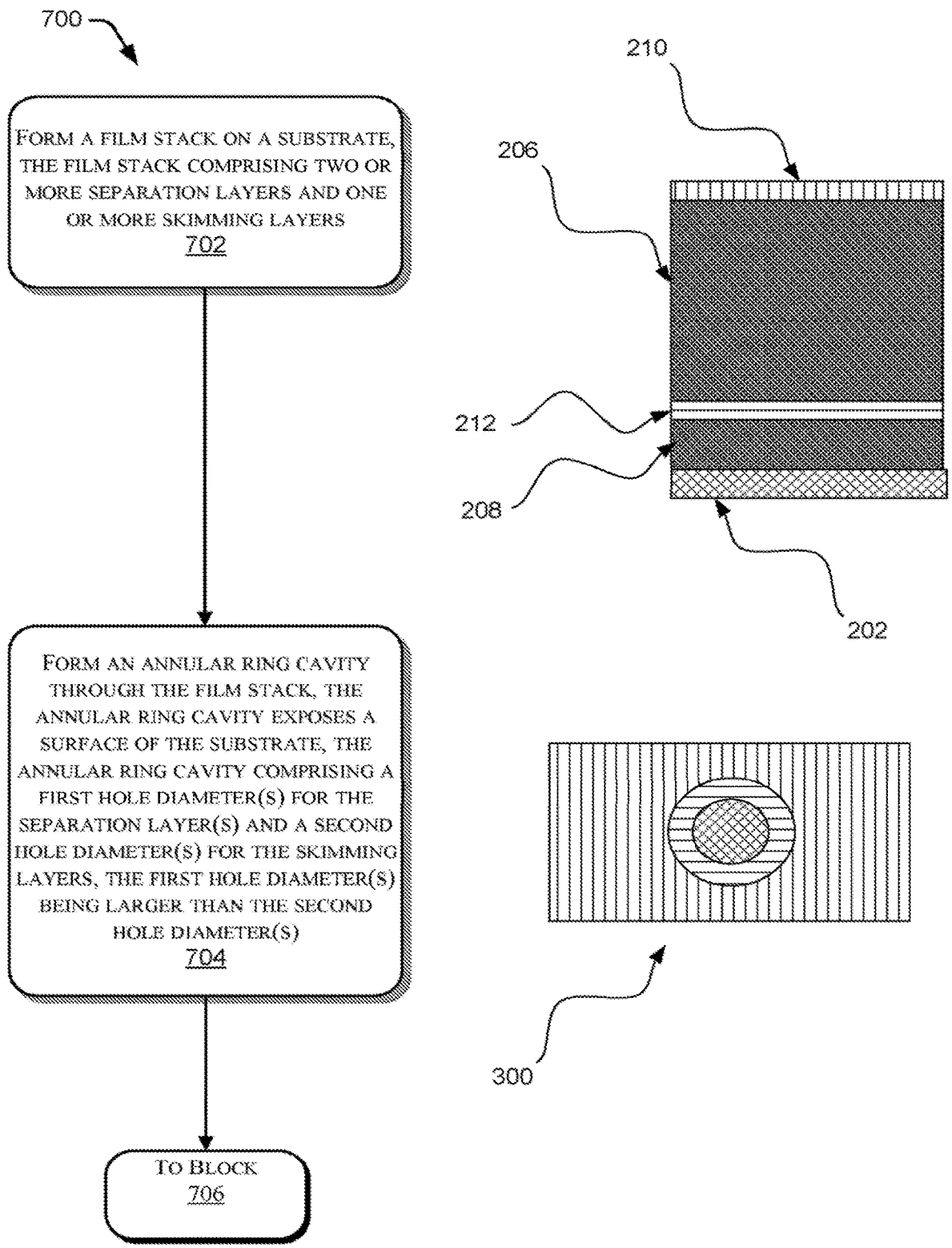
FIGS. 7A-7B is a flow diagram for another method for generating a pre-patterned template that may be used to form an MTJ cell on a substrate, including representative cross-section illustrations of the pre-patterned template during the implementation of the method of the substrate, according to at least one embodiment.
Figure 7B:
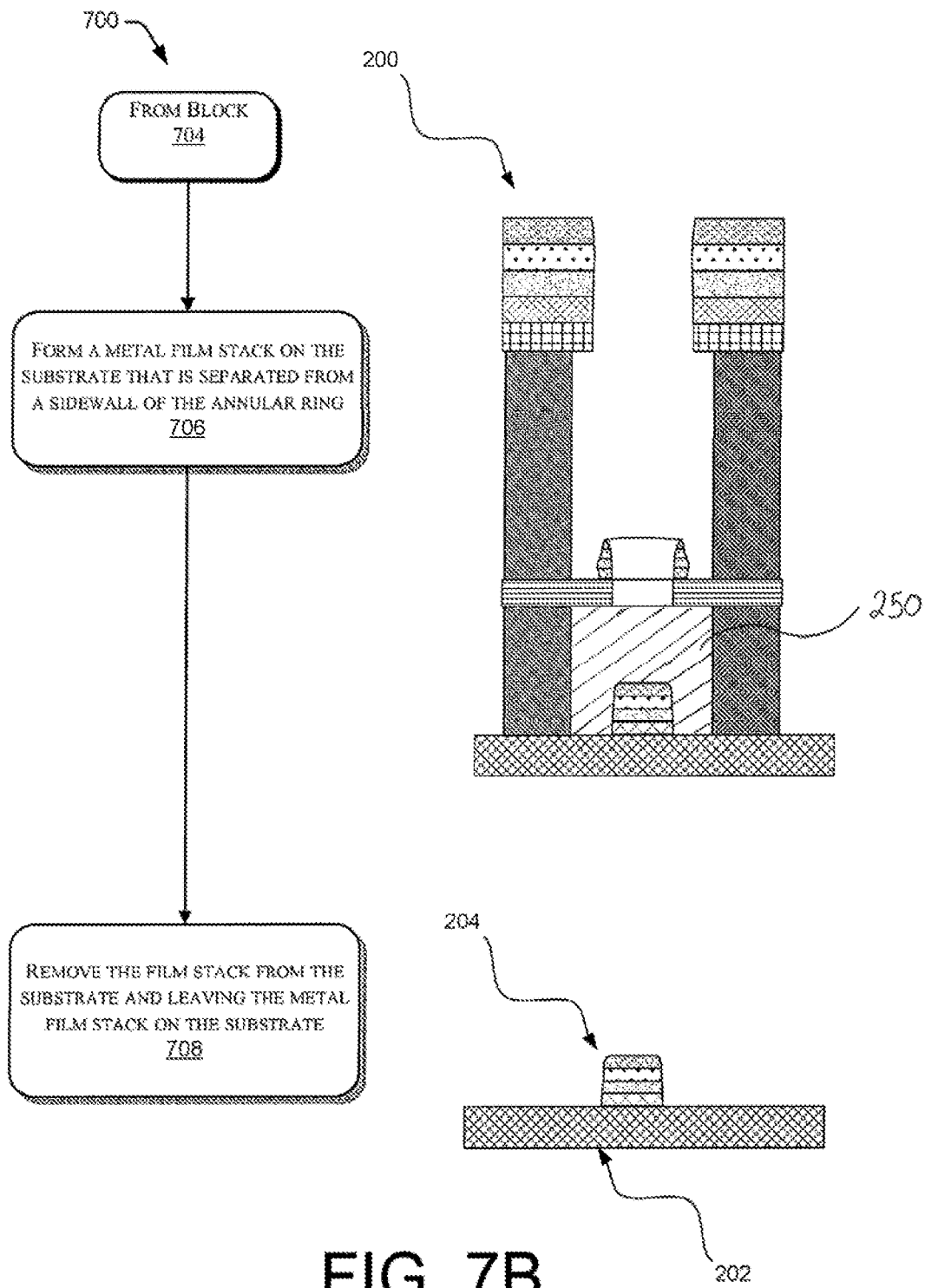

FIGS. 7A-7B include a another flow diagram 700 for another method for generating a pre-patterned template 200 that may be used to form an MTJ 104 cell on a substrate 202. In the FIG. 7 embodiment, the pre-patterned template 200 incorporates an annular-cavity that exposes portions of the substrate 202 that is underneath the film stack used to form the pre-patterned template 200. This method may incorporate multiple process steps that may not be explicitly incorporated into the method outlined in FIGS. 7A-7B. These steps may be carried out using a variety of techniques and the claims are not intended to be limited to the techniques disclosed herein.

At block 702, a film stack may be formed on the substrate 202 that may include two or more blanket deposited layers that may be patterned and etched to form the pre-patterned template 200. The film stack may include, but is not limited to, two or more films that may be used to form the offset layers and the aperture layers with the pre-patterned template 200. As noted above in the description of FIGS. 3-5, the offset layers and the aperture layers may vary in thickness according to the thickness and uniformity requirements of the MTJ 104. Generally, the film stack may range between 300 nm and 1000 nm and the offset layers comprise a thickness between 30 nm and 1000 nm and the aperture layers comprise a thickness between 5 nm to 30 nm. However, these thickness embodiments are intended merely for illustration and are not intended to limit the scope of the claims. Also, the number of offset and aperture layers may also vary depending on the application, as shown in FIGS. 3 and 5.

In one specific embodiment, the film stack may include two offset layers and two aperture layers, wherein the film stack comprises a first aperture layer 210 disposed on the first offset layer 206 which is in physical contact with the second aperture layer 212 that is disposed on the second offset layer 208 which is disposed on the substrate 202. Generally, the second aperture layer 212 is located closer to the substrate 202 than the first aperture layer 210, such that the first offset layer 206 is thicker than the second offset layer 208. This arrangement increases the surface area available to remove isotropic metal ions that pass through the first aperture layer 210. Also, the shorter distance between the second aperture layer 212 and the substrate 202 also decreases the distance available for non-anisotropic metal ions that would prevent anisotropic deposition of the metals layers on the substrate 202.

In this embodiment, the first offset layer 206 may have a thickness between 300 nm and about 1000 nm while the second offset layer 208 may have a thickness ranging between 20 nm and 50 nm. In contrast, the aperture layers may be much thinner than the offset layers in most embodiments, however this is not required in all embodiments. In one instance, the first aperture layer 210 and second aperture layer 212 may have thicknesses between 5 nm and 30 nm. However, in other embodiments, the aperture layers are not required to have the same thicknesses and may vary depending on the application.

In another specific embodiment, the film stack may include three offset layers with three aperture layers, as shown in pre-patterned lensing template 500 in FIG. 5. The offset layers will separate the aperture layers at varying distances that generally become greater as the offset layers become further away from the substrate 202. In this instance, the third offset layer 504 may be disposed between the first offset layer 206 and the second offset layer 208. The first offset layer 206 may have a thickness of about 200 nm and be disposed directly between the first aperture layer 210 and the third aperture layer 502. The third offset layer 504 may be disposed between the third aperture layer 502 and the second aperture layer 212. The third offset layer 504 may have a thickness of about 100 nm which thicker than the second offset layer 208 which may have a thickness of less than 50 nm.

Again, the aforementioned embodiments, the film stacks may include dielectric materials that may be selected based, at least in part, on their ability to be selectively etched with respect to each other when exposed to different plasma chemistries. Additionally, the selected materials should be able to be uniformly deposited across the substrate 202 and have sufficient adhesive properties to remain contact with each other. In one specific embodiment, the offset layer may be silicon oxide and the aperture layers may be silicon nitride.

At block 704, an annular ring cavity (e.g., top view illustration 300) through the film stack to expose a surface of the substrate 202. The annular ring cavity may include a first hole diameter(s) for the offset layer(s) and a second hole diameter(s) for the aperture layers. Generally, the, the first hole diameter(s) being larger than the second hole diameter(s). The annular ring cavity may be formed using an iterative patterning and etch process that enables the aperture layers to protrude from the cavity sidewall by forming holes or openings within each layer. In one specific embodiment, the first hole diameters may range between 30 nm and 50 nm and the second hole diameters range between 40 nm and 100 nm, as shown by way of example in FIG. 3.

In other annular ring cavity embodiments, the openings within the film stack may be oblong and are not required to be perfectly circular, such that the dimensions stated in the description of block 704 may be approximated to any desired geometry of the MTJ 104. Further, other embodiments may include additional offset and aperture layers, as shown in FIG. 5.

In another specific embodiment, the film stack may include three offset layers with three aperture layers, as show in pre-patterned lensing template 500 in FIG. 5. The offset layers will separate the aperture layers at varying distances that generally become greater as the offset layers become further away from the substrate 202. For example, the first offset layer 206 may be thicker (e.g., 200 nm) than the second offset layer 208 (e.g., 50 nm) and the third offset layer 504 (e.g., 100 nm). Additionally, the openings in the corresponding aperture layers may also vary in diameter, such that the first aperture layer 210 (e.g., 50 nm) may be larger than the second aperture layer 212 (e.g., 30 nm) and the third aperture layer 504 (e.g., 40 nm). However, in other embodiments, the openings may be the same or be of similar size. For example, the first aperture layer 210 and the third aperture layer 504 may have similarly sized openings while the second aperture layer 212 may be smaller by about 10 nm to 30 nm. In another embodiment, the second aperture layer 212 and the third aperture layer 504 may have similarly sized openings while the first aperture layer 210 may be larger by about 10 nm to 30 nm.

At block 706, the metal film layers may be deposited through the pre-patterned template 200, such that the MTJ 104 on the substrate is physically separated from the sidewall of the annular ring cavity. As noted above, the pre-patterned template 200 skims the metal ions that are least likely to result in a uniform metal layer on the substrate 202. The metal film layers may include at least two different types that include, but are not limited to, Ta, Ru, Pt, Co, Fe, Ni, Mg, or any combination thereof that may be used to form the free layer 116 and the fixed layer 114, as described in the description of FIG. 1. Additionally, there may be a barrier layer 112 that may be disposed between two of the metal layers and may include any dielectric material (e.g., MgO) that may restrict the movement of electrons between the fixed layer 114 and the free layer 116.

At block 708, the pre-patterned template 200 may be removed from the substrate 202 using any reactive ion etching treatment, any chemical-mechanical polishing treatment, a wet chemical treatment, or any combination thereof that may be known to a person of ordinary skill in the art of semiconductor processing. In some embodiments, a fill layer may be deposited onto the pre-patterned template 200 to fill the annular ring cavity prior to removal of the pre-patterned template 200. In this instance, the fill layer may enable a more uniform removal process by preventing fluid communication directly to the MTJ 104 on the substrate 202. In this way, more aggressive removal techniques may be applied to the pre-patterned template 200 while minimizing any damage to the MTJ 104. The fill layer may include any material that maybe the same or similar to the offset layer or aperture layer materials, however similar materials between the offset layers, aperture layers, and the fill layer are not required in all embodiments.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A method for treating a substrate, comprising:
   forming a film stack on the substrate, the film stack comprising two or more aperture layers separated by at least one offset layer;
   forming a cavity in the film stack that exposes a portion of the substrate;
   removing portions of the offset layer from within the cavity such that at least one of the aperture layers protrudes into the cavity; and
   forming a metal film stack on the substrate, the metal film stack comprising at least two different types of metals and a metal oxide layer disposed between at least two of the metal layers of the metal film stack.

2. The method of claim 1, wherein the metal film stack on the substrate is physically separated from the film stack.

3. The method of claim 1, wherein the at least one offset layer comprises two or more offset layers which comprise silicon oxide, and the aperture layers comprise silicon nitride.

4. The method of claim 3, wherein the two or more offset layers comprise a first dielectric material composition and a second dielectric material composition that is different from the first dielectric material composition.

5. The method of claim 1, wherein the cavity comprises two or more cavities disposed within the film stack that expose different portions of the substrate.

6. The method of claim 1, wherein the removing of the at least one offset layer comprises removing portions of the at least one offset layer at a higher rate than the aperture layers.

7. The method of claim 1, wherein the removing of the at least one offset layer comprises removing portions of a first aperture layer at a higher rate than a second aperture layer that is disposed between the first aperture layer and the substrate.

8. The method of claim 1, wherein the forming of the metal stack comprises depositing two or more layers of different metal compositions on the substrate.

9. The method of claim 1, wherein the at least two different metal layers comprise at least two of the following metals: Ta, Ru, Pt, Co, Fe, Ni, Mg, or any combination thereof.

10. The method of claim 1, wherein the metal oxide layer comprises an MgO layer disposed between at least two of the metal layers.

11. A method for treating a substrate, comprising:
forming a film stack on a substrate, the film stack comprising two or more aperture layers separated by at least one offset layer;
forming a cavity through the film stack such that the cavity exposes a surface of the substrate, the cavity comprising a first opening for the at least one offset layer and second opening for the aperture layers, the first opening having a larger area than an area of the second opening;
forming a metal film stack on the substrate that is separated from a sidewall of the cavity; and
removing the film stack from the substrate and leaving the metal film stack on the substrate, the metal film stack comprising a metal oxide layer disposed between at least two metal layers of the metal film stack.

12. The method of claim 11, wherein the film stack comprises a thickness between 300 nm and 1000 nm and the at least one offset layer comprises a thickness between 30 nm and 1000 nm and the aperture layers comprise a thickness between 5 nm to 30 nm.

13. The method of claim 11, wherein the film stack comprises:
a first aperture layer comprising a thickness between 5 nm and 30 nm;
a first offset layer disposed in physical contact with the first aperture layer, the first offset layer comprising a thickness between 300 nm and 1000 nm;
a second aperture layer disposed in physical contact with the first offset layer, the second aperture layer comprising a thickness between 5 nm and 30 nm; and
a second offset layer disposed in physical contact with the second aperture layer, the second offset layer comprising a thickness between 20 nm and 50 nm.

14. The method of claim 13, wherein the film stack further comprises:
a third aperture layer comprising a thickness between 5 nm and 30 nm and a pass-through diameter between 30 nm and 50 nm; and
a third offset layer disposed in physical contact with the third aperture layer, the third offset layer comprising a thickness between 300 nm and 1000 nm.

15. The method of claim 11, wherein the first opening is a hole having a diameter between 30 nm and 50 nm and the second opening is a hole having a diameter between 40 nm and 100 nm.

16. The method of claim 11, wherein the film stack comprises a first offset layer thickness between 30 nm and 1000 nm and the aperture layers comprise a thickness of less than 10 nm.

17. The method of claim 11, wherein the removing of the film stack comprises applying a fill layer into the cavity that covers the metal film stack.

18. The method of claim 17, wherein the removing of the film stack and the fill layer comprises exposing the substrate to a reactive ion etching treatment, a chemical-mechanical polishing treatment, a wet chemical treatment, or any combination thereof.

19. A method for treating a substrate, comprising:
forming a film stack on the substrate, the film stack comprising two or more layer offset layers and at least one aperture layer;
forming a cavity in the film stack that exposes a portion the substrate;
removing portions of the offset layers from within the cavity such that the aperture layer protrudes into the cavity; and
forming a metal film stack on the substrate, the metal film stack comprising at least two different types of metals,
wherein the removing of the offset layers comprises removing portions of the offset layers at a higher rate than the aperture layer, and
wherein the film stack comprises two or more aperture layers separated by at least one offset layer and a metal oxide layer disposed between at least two of the metal layers of the metal film stack.

20. The method of claim 19, wherein the removing of the offset layers comprises removing portions of a first aperture layer at a higher rate than a second aperture layer that is disposed between the first aperture layer and the substrate.

* * * * *

UNITED STATES PATENT AND TRADEMARK OFFICE
CERTIFICATE OF CORRECTION

PATENT NO. : 10,665,779 B2  
APPLICATION NO. : 16/127042  
DATED : May 26, 2020  
INVENTOR(S) : Noel Russell et al.

Page 1 of 1

It is certified that error appears in the above-identified patent and that said Letters Patent is hereby corrected as shown below:

On the Title Page

Item (54), Line 2, delete "A STT MRAM STACK" and insert -- A STT-MRAM STACK --, therefor.

In the Claims

In Column 18, Lines 37-38, Claim 19, delete "a portion the substrate" and insert -- a portion of the substrate --, therefor.

Signed and Sealed this  
Ninth Day of March, 2021

Drew Hirshfeld  
*Performing the Functions and Duties of the*  
*Under Secretary of Commerce for Intellectual Property and*  
*Director of the United States Patent and Trademark Office*